United States Patent [19]

Carlson et al.

[11] Patent Number: 4,704,188

[45] Date of Patent: Nov. 3, 1987

[54] WET CHEMICAL ETCHING OF CRXSIYNZ

[75] Inventors: Robert J. Carlson; Paulette S. Shelburne, both of Brooklyn Park, Minn.

[73] Assignee: Honeywell Inc., Minneapolis, Minn.

[21] Appl. No.: 564,793

[22] Filed: Dec. 23, 1983

[51] Int. Cl.$^4$ ................................................ B44C 1/22
[52] U.S. Cl. ...................................... 156/656; 156/657; 156/662; 156/664; 252/79.3
[58] Field of Search .............. 156/625, 634, 657, 656, 156/662, 659.1, 653, 660, 664; 204/192 R, 192 F; 29/610 R, 620; 427/101, 102; 219/121 LJ; 338/308, 309; 252/79.2, 79.3

[56] References Cited

U.S. PATENT DOCUMENTS

| 3,423,260 | 1/1969 | Heath et al. ..................... 156/656 X |
| 4,100,014 | 7/1978 | Kuhn-Kuhnenfeld et al. ... 252/79.3 X |
| 4,392,992 | 7/1983 | Paulson et al. .................. 427/102 X |

FOREIGN PATENT DOCUMENTS

| 49-48271 | 12/1974 | Japan ..................................... 156/656 |
| 50-09269 | 4/1975 | Japan ..................................... 252/79.3 |
| 54-97546 | 8/1979 | Japan ..................................... 252/79.3 |
| 56-29324 | 3/1981 | Japan ..................................... 252/79.3 |

Primary Examiner—Donald E. Czaja
Assistant Examiner—Ramon R. Hoch
Attorney, Agent, or Firm—William T. Udseth

[57] ABSTRACT

Thin films of chromium/silicon/nitrogen are etched in a solution of HF, $H_2O_2$, HCl, and $H_2O$.

20 Claims, 2 Drawing Figures

WET CHEMICAL ETCHING OF CRXSIYNZ

The present invention relates to patterning of thin film electrical resistors, and more particularly to wet chemical etching of thin film resistors including chromium, silicon, and nitrogen.

BACKGROUND OF THE INVENTION

A common desire in the field of semiconductor integrated circuits is the provision of thin film electrical resistors on an individual integrated circuit chip or on a substrate to be associated with one or more of such chips. Typically such resistors are formed by providing a uniform thin film over all or a substantial portion of the surface on which the resistors are desired. A photoresist material is then coated over the thin film. The photoresist is exposed and developed, leaving a coating of photoresist over those portions of the thin film which are to be retained, but no resist covering those portions of the film to be removed.

The film is then subjected to an etching process. The regions of the film covered by the resist material are protected from etching and thus retained on the surface, while those portions unprotected by the resist are removed. The resist layer may then be removed, leaving the completed electrically resistive structures.

The etching step of the above description could involve any of a number of different etching processes. For example, it could be a plasma etch or a wet chemical etch. In a wet chemical etch the assembly including the film to be etched is placed in a solution including the etchant.

Thin film resistors of the type described are sometimes formed of a combination of chromium and silicon. Wet chemical etching of the chromium silicon resistors has often been performed by using a combination of HF, HCl, and $H_2O$. Recently, the inclusion of nitrogen in the chromium silicon mixture has been found to improve the performance of the electrical resistors formed. Unfortunately the films containing chromium, silicon, and nitrogen cannot effectively be etched using the above etchant. Therefore, if wet chemical etching of such resistive films is to be performed a different etchant must be identified.

SUMMARY OF THE INVENTION

The present invention utilizes a mixture of HF, $H_2O_2$, HCl, and $H_2O$ to perform a wet chemical etch on $Cr_xSi_yN_z$ thin films.

DESCRIPTION OF A PREFERRED EMBODIMENT

Figure 1:
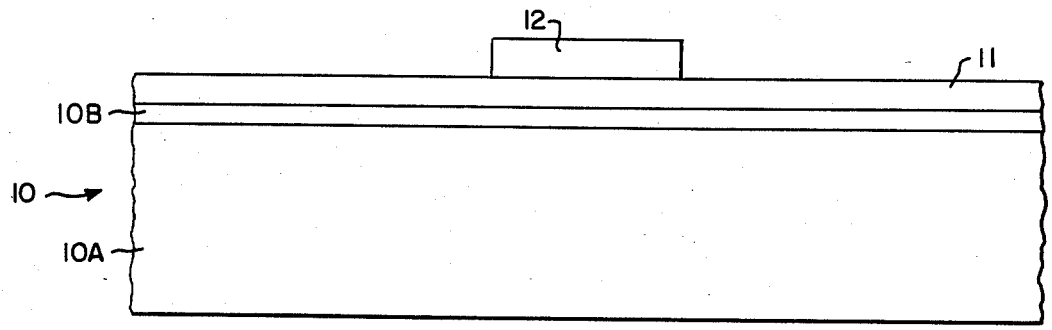
FIG. 1 shows a substrate with a $Cr_xSi_yN_z$ thin film and a patterned photoresist material.

FIG. 1 shows a substate and film assembly prepared for etching. In FIG. 1 substrate 10 has a uniform thin film of $Cr_xSi_yN_z$, where the values of x, y, and z depend on film stoichiometry, formed thereon. Substrate 10 tyically would be an integrated circuit chip of silicon 10A with layer of $SiO_2$ 10B thereon. Alternatively, however, substrate 10 could include a semiconductor material other than silicon, or could be a packaging substrate on which integrated circuit chips are to be mounted. Furthermore other dielectrics, such as $SiN_3$ could be used. Such packaging substrates are typically of a ceramic material, such as alumina. Other substrate materials may be used also.

A photoresist layer is coated over $Cr_xSi_yN_z$ layer 11, and exposed and developed, leaving etching mask 12 on layer 11.

When etching mask 12 has been positioned properly on film 11 the film is ready for etching. A solution of HF, $H_2O_2$, HCl, and $H_2O$ is prepared. In the preferred embodiment these chemicals are mixed in a ratio of 8:1:20:20, respectively. The etch may be performed at room temperature, where room temperature is taken to be a temperature of approximately $71°\pm1°$ F. The film may be immersed in the etchant and agitated. Alternatively the etchant may be sprayed onto the portion of the film to be etched. In one test a 500 Angstrom thick film of $Cr_xSi_yN_z$ was completely removed by etching with the solution described above for six minutes and thirty seconds at 71° F.

Figure 2:
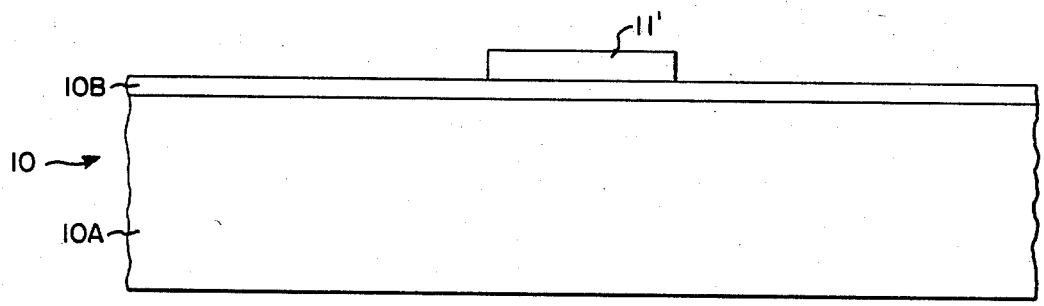
FIG. 2 shows the same substrate and thin film following etching and removal of the photoresist.

After the etching is completed the etching mask 12 may be removed leaving only the thin film electrical resistors desried. The removal of the photoresist should be accomplished by a nonoxidizing process to avoid damage to the $Cr_xSi_yN_z$ film. A nonoxidizing solvent may be used. A second removal technique is the exposure of the resist to a nitrogen plasma. Another technique, which may be used with a positive resist, is to expose the remaining resist material to light and develop it. As the portions of the resist which are exposed are removed during development, this technique will remove the film. FIG. 2 illustrates a final structure such as may result following etching of resistive film 11 and removal of etching mask 12. In FIG. 2 thin film resistor 11' is the remnant of thin film 11 of FIG. 1 following the etching process.

The embodiments of the invention in which an exclusive property or right is claimed are defined as follows:

1. A method of patterning $Cr_xSi_yN_z$ films by wet chemical etching, where x, y, and z are positive numbers, said method comprising the steps of:

forming a $Cr_xSi_yN_z$ film on a first surface of a substrate;

forming an etching mask on said film, said etching mask covering a first portion of said film and leaving uncovered a second portion of said film;

exposing said film to a solution of HF, $H_2O_2$, HCl, and $H_2O$; and removing said etching mask.

2. The process of claim 1 wherein said HF, $H_2O_2$, HCl, and $H_2O$ are in a ratio of 8:1:20:20 respectively.

3. The process of claim 2 wherein said solution is immersed is at $71°\pm1°$ F.

4. The process of claim 1 wherein said substate is of a semiconductor material.

5. The process of claim 4 wherein said semiconductor material comprises silicon.

6. The process of claim 5 wherein said HF, $H_2O_2$, HCl, and $H_2O$ are in a ratio of 8:1:20:20, respectively.

7. The process of claim 6 wherein said solution is at $71°\pm1°$ F.

8. The process of claim 1 wherein said substrate is of a ceramic material.

9. The process of claim 8 wherein said HF, $H_2O_2$, HCl, and $H_2O$ are in a ration of 8:1:20:20, respectively.

10. The process of claim 9 wherein said solution is at $71°\pm1°$ F.

11. The process of claim 1 wherein said solution is sprayed on said film.

12. The process of claim 11 wherein said HF, $H_2O_2$, HCl, and $H_2O$ are in a ratio of 8:1:20:20 respectively.

13. The process of claim 12 wherein said solution is at $71° \pm 1°$ F.

14. The process of claim 1 wherein said film is immersed in said solution.

15. The process of claim 14 wherein said solution is agitated while said film is immersed therein.

16. The process of claim 15 wherein said HF, $H_2O_2$, HCl, and $H_2O$ are in a ratio of 8:1:20:20 respectively.

17. The process of claim 16 wherein said solution is at $71° \pm 1°$ F.

18. The process of claim 1 wherein said etching mask is removed by a nonoxidizing process.

19. The process of claim 18 wherein said HF, $H_2O_2$, HCl, and $H_2O$ are in a ratio of 8:1:20:20 respectively.

20. The process of claim 19 wherein said solution is at $71° \pm 1°$ F.

* * * * *